United States Patent [19]

Hartman et al.

[11] Patent Number: 4,843,312
[45] Date of Patent: Jun. 27, 1989

[54] TEST METHOD FOR LCD ELEMENTS

[75] Inventors: Robert A. Hartman; Hans P. Peloschek, both of Eindhoven, Netherlands

[73] Assignee: U.S. Philips Corporation, New York, N.Y.

[21] Appl. No.: 174,564

[22] Filed: Mar. 29, 1988

[30] Foreign Application Priority Data

Apr. 21, 1987 [NL] Netherlands .................. 8700933

[51] Int. Cl.⁴ .............................................. G01R 31/26
[52] U.S. Cl. ................................. 324/158 R; 250/310
[58] Field of Search ............... 324/71.3, 73 R, 73 PC, 324/158 R, 158 P, 158 T, 158 D; 250/310, 311, 492.2

[56] References Cited

U.S. PATENT DOCUMENTS

| 3,969,670 | 7/1976 | Wu | 324/73 PC |
|---|---|---|---|
| 4,169,244 | 9/1979 | Plows | 324/73 PC |
| 4,296,372 | 10/1981 | Feuerbaum | 324/71.3 |
| 4,404,635 | 9/1983 | Flaker | 324/73 R |
| 4,415,851 | 11/1983 | Langner | 324/158 R |
| 4,471,302 | 9/1984 | Fazekas | 324/73 R |
| 4,573,008 | 2/1986 | Lischke | 324/73 PC |
| 4,577,147 | 3/1986 | Frosien | 324/71.3 |
| 4,578,279 | 3/1986 | Zingher | 324/73 PC |
| 4,609,867 | 9/1986 | Schink | 324/158 D |
| 4,629,898 | 12/1986 | Orloff | 324/158 D |
| 4,644,264 | 2/1987 | Beha | 324/158 D |
| 4,721,910 | 1/1988 | Bokor | 324/158 R |
| 4,745,360 | 5/1988 | Reimer | 324/158 R |
| 4,755,746 | 7/1988 | Mallory | 324/73 R |

Primary Examiner—Michael J. Tokar
Attorney, Agent, or Firm—Paul R. Miller

[57] ABSTRACT

Picture electrodes of an LCD semi-manufactured product in which normal addressing is not possible are scanned by means of an electron beam (7) in order to test the associated switching elements (13, 20). In a different type of LCD semi-manufactured product the quality of the switching elements (23, 24) can be monitored by means of irradiation with a laser beam (5).

14 Claims, 2 Drawing Sheets

TEST METHOD FOR LCD ELEMENTS

The invention relates to a method of testing a part of a display device including a switching element between at least one drive line and a pat of a pixel to be formed.

In this Application switching elements are to be understood to mean, inter alia, thin-film transistors (FETs), diodes and, for example, MIMs (metal-insulator-metal), and also, for example, combinations of diodes as are used, inter alia, in diode rings or switching elements comprising a plurality of sub-elements for the purpose of redundancy.

In larger display devices, notably active liquid crystal display devices which are organised in accordance with a matrix, the number of switching elements, and hence the risk of non-functioning or malfunctioning switching elements, increases rapidly. Since the chance of rejection of the finished product increases, there is a need to test intermediate products. A problem is that unlike, for example, semiconductor products, the product cannot be tested functionally at an early stage (such as, for example, ICs on the wafer before connection and finishing), The finished product cannot be tested electrically or electronically because the optical switching must be checked, for example, visually. Since a finished product is concerned, including drive electronics, it is a great advantage in view of cost considerations if a sub-product which in itself already comprises a large part of the overall product such as, for example, a first supporting plate of a liquid crystal display device with switching elements, can be tested in a simple manner (and repaired if necessary). Not only does this lead to a reduced number of rejects of the final product but also to material saving (inter alia, liquid crystal material, second supporting plates). It is also possible to take action in the manufacturing process at an earlier stage.

It is an object of the invention to provide such a test method.

To this end a method of the type described in the opening paragraph is characterized in that the switching element or the part of the pixel to be formed is scanned by means of an energy beam.

The energy beam may be, for example, an electron beam or a light beam, paticularly a laser beam.

In this respect it is to be noted that testing by means of a laser beam or an electron beam for semiconductor arrangements is known per se from IC technology. However, in this technology extra switching elements are generally provided such as thyristors. (German Patent Specification No. 31,787), photosensitive switches (U.S. Pat. No. 3,801,910) or additional supply lines (FR No. 2,316,728). In the parts to be tested of a display device such extra provisions would render the manufacture of such parts additionally complicated. Similar drawbacks apply to the method of testing display devices as described in EP-A-0, 143,039. Moreover, the finished display device is tested in this case so that all above-mentioned drawbacks apply. In this method a test on the presence of connections is also performed by means of irradiation of additionally provided photodiodes, which is in contradistinction to the method according to the invention in which the actual switching elements are directly tested by scanning them or the associated pixels with an energy beam. Such extra provisions are in principle entirely superfluous when testing by means of the method according to the invention.

The invention will now be described in greater detail by way of example with reference to the accompanying drawings in which FIG. 1 shows a first example of the method;

FIG. 3 shows an example of the method of testing parts of a device such as shown in Netherlands patent application No. 8,502,663 corresponding to U.S. application Ser. No. 913,175 filed Sept. 26, 1986, while

Figure 1:
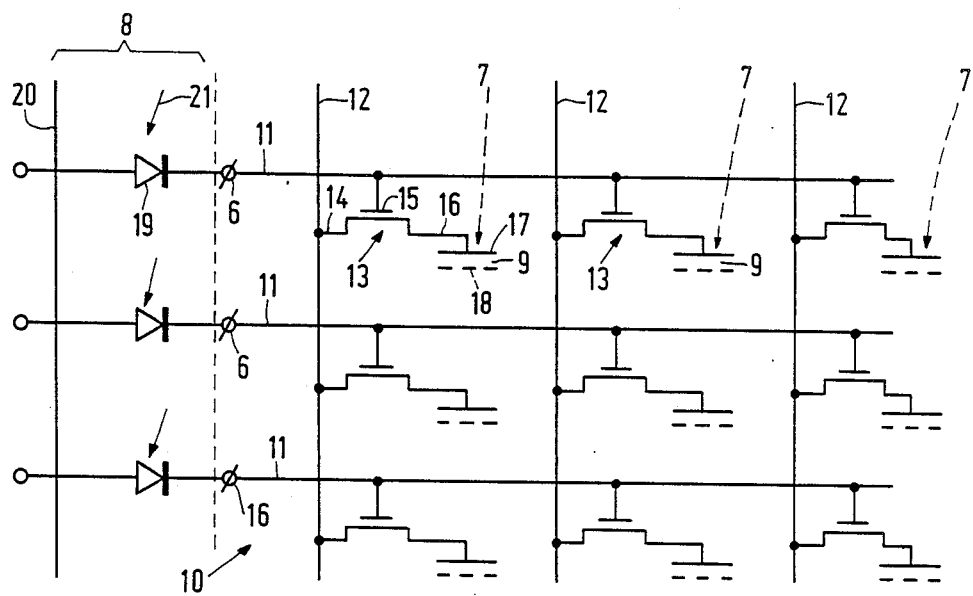

FIG. 1 shows diagrammatically a part of a display device 10 which is in the form of a matrix in this example. The matrix comprises row electrodes 11 and column electrodes 12. At the area of the crossings of row electrodes and column electrodes liquid crystal elements 9 are connected via a switching element, in this example a thinfilm field effect transistor 13, to the row electrodes 11 and the column electrodes 12. The liquid crystal pixels comprise a picture electrode 17 which in this example is arranged on the same supporting plate as the electrodes 11, 12 and the transistors 13. Furthermore the pixels comprise a counter electrode 18 on a second supporting plate which is shown by means of broken lines in FIG. 1.

According to the invention the part of the device which is present on the first supporting plate is tested first before the two supporting plates are secured together and subsequently the space between the supporting plates is filled with liquid crystal material and then closed. There are different possibilities for this purpose.

According to a first method the gate 15 of the thin film field effect transistor 13 can acquire such a voltage via the row electrode 11 that the transistor 13 is turned on. Simultaneously with the selection of a transistor 13, for example, the picture electrode 17 connected to the drain zone 16 of the transistor is given a quantity of negative charge. This may be done by scanning the relevant picture electrode 17 with an electron beam 7. The charge present on the picture electrode can subsequently be detected via the conducting transistor 13 and the column electrode 12 (which is connected to the source zone 14 of the transistor 13) with the aid of means which are generally known. The detection or non-detection of the charge is an indication of a transistor 13 functioning properly or improperly or of interconnections which are present or not present.

C onversely, the picture electrodes 17 can be given a charge via the transistors 13 by selecting a transistor 13 via a row electrode 11 and by giving the source zone 14 such a voltage via a column electrode 12 that the associated picture electrode 17 is charged. The charge of the picture electrode 17 can then be detected again by scanning with an electron beam 7 in a scanning electron microscope. This provides the possibility of fault detection.

The row electrodes 11 may be selected directly via connection terminals 6 but, if desired, also via an auxiliary circuit 8 in which a plurality of radiation-sensitive switching elements, in this example photosensitive diodes 19, are provided between the connection terminals 6 of the row electrodes 11 and a test voltage line 20. By irradiating one of the diodes 19 with radiation 21 of suitable wavelength this diode becomes conducting and the associated row electrode 11 acquires the desired voltage.

Figure 2:
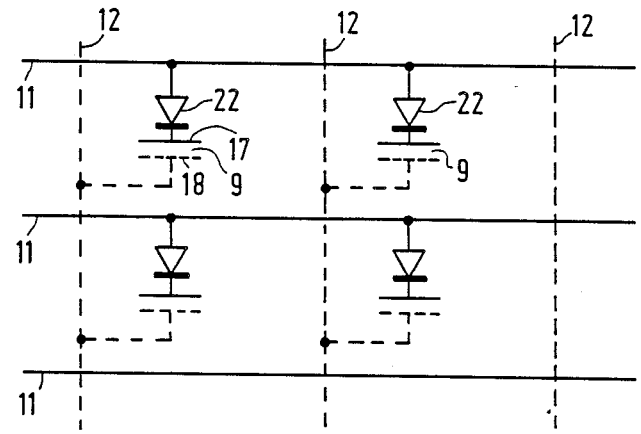
FIG. 2 shows a variant of this method for another structural type of the display device.

FIG. 2 shows a part of a similar matrix in which the switching elements are now constituted by diodes 22, while the column electrodes 12 and the row electrodes 11 are now arranged on different supporting plates. The part comprising the row electrodes 11, the diodes 22 and the picture electrodes 17 can be tested similarly as described with reference to FIG. 1. The column electrodes 12 (shown by means of solid lines) and the counter electrode 18 are arranged on the second supporting plate.

Figure 3:
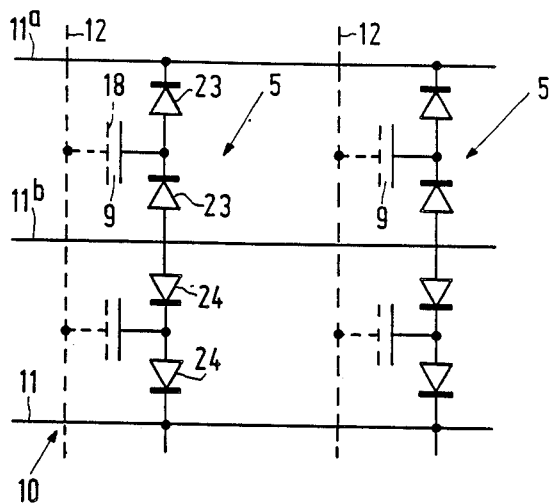

FIG. 3 shows diagrammatically a part of another display device 10 with a drive circuit which is suitable for the drive mode as described in Netherlands patent application No. 8,502,663 corresponding to U.S. patent application Ser. No. 913,175, filed Sept. 28, 1986 Since all diodes 23 are arranged parallel between the row electrodes 11a, 11b, separate electrical testing is not possible. The pairs (or each of the diodes 23 separately) may be irradiated by means of a laser beam 5. The diodes 23 are considered to be manufactured of a photosensitive material such as, for example, amorphous silicon. Under the influence of the irradiation a photocurrent I $\phi$ starts flowing between the row electrodes 11a, 11i b whose characteristic can be tested in a manner which is generally known. (in this case the voltage at row electrode 11a is assumed to be higher than that at row electrode 11b).

The column electrodes 12 and the counter electrodes 18 are present on the other supporting plate and can therefore not be used in the test.

Figure 4:
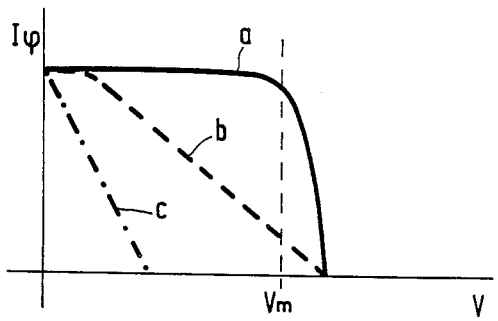
FIG. 4 shows examples of the associated test characteristic curves and FIG. 5 shows a method of testing and, if necessary, repairing a similar part of the device as shown in FIG. 1.

If one of the two diodes is not connected or if a connection is interrupted in another way, the photocurrent does not lead to a change in the current measured. The current/voltage characteristic (curve a in FIG. 4) may also show deviations due to a too high series resistance (curve b in FIG. 4), or, for example, a too low parallel resistance (curve c in FIG. 4) or a short circuit. With the aid of the current measured at, for example, a test voltage Vm (FIG. 4) it is then possible, for example, to test the presence of the diodes 23 but also to realise a certain form of process control and quality control. The diodes 24 can be tested in a similar manner.

Figure 5:
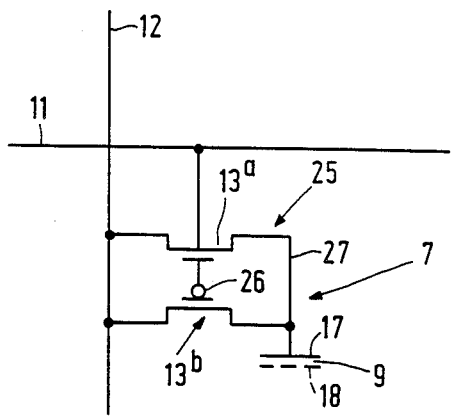

In all examples shown it holds that the switching elements may have a multiple form for the purpose of redundancy. In FIG. 5 the field effect transistor 13 of the device of FIG. 1 is in a dual form of transistors 13a, 13b. In principle the row electrode 11 is connected to the gate of transistor 13a and extends almost as far as the gate of transistor 13b. If it appears that during a test as described with reference to FIG. 1 transistor 13 a is not connected or is malfuncioning in another way, it is possible to provide a joint 26 between the row electrode 11 and the gate of transistor 13a by means of the laser beam 25. If necessary, the same laser beam 25 may also be used to remove the connection between the row electrode 11 and the gate of transistor 13a or the connection between transistor 13a and other elements (such as the connection 27 with picture electrode 17). On the other hand the two transistors 13a, 13b may already be both connected in advance while after charging of picture electrodes 17 with an electron beam each transistor 13a, 13b can be irradiated by means of a laser beam so that a faulr detection can be carried out. If necessary, the connection of a malfunctioning transistor can then be interrupted again by means of a laser beam.

The invention is of course not limited to the examples shown but several variations which are well known to those skilled in the art are possible within the scope of the invention. Switching elements such as diode rings can be alternatively tested by means of laser radiation; a condition is that the diodes associated with the diode ring are laterally separated. The method described with reference to FIG. 2 may be alternatively used for switching elements other than diodes such as, for example, varistors, MIMs or other dipoles. Likewise the field effect transistors in the example of FIG. 1 may be replaced by other threepoles. In a possible auxiliary circuit 8 the number of photodiodes 19 may be alternatively reduced by connecting one photodiodes 11, while radiation-sensitive resistors instead of photodiodes can be used alternatively. Finally the parts of the devices to be tested need not necessarily form part of a display device which is organised as a matrix, while the invention can be alternatively used for display devices other than liquid crystalline devices.

What is claimed is:

1. A method of testing display devices during construction, said display devices including portions of at least one display element, at least one drive line, and at least one switching element connected between said portions of said display elements and said drive lines, said method comprising the steps of
    scanning at least one of said switching elements or said portions of said display elements by an energy beam, and
    detecting presence or flow of charges on said at least one of said switching elements or portions of said display elements to determine operation of said switching elements and portions of said display elements.

2. A method according ot claim 1, wherein an electron beam is used as said energy beam.

3. A method according to claim 2, wherein said portions of said at least one display element include pixels, and said pixels are charged by said electron beam, and wherein said at least one switching element is tested in operation by discharging said pixels by said switching element.

4. A method according to claim 2, wherein said portions of said at least one display element include pixels, said pixels being charged by said switching elements, and wherein a scanning electron microscope tests suppy of charge to said pixels.

5. A method according to claim 4, wherein said switching element is a radiation-sensitive switching element being irradicated by a light beam, said irradiation forming a charge current providing charge to said pixels.

6. A method according to claim 5, wherein said light beam is a laser beam.

7. A method according to claim 1, wherein a light beam is used as said energy beam.

8. A method according to claim 7, wherein said light beam is a laser beam.

9. A method according to claim 7, wherein said switching elements include at least one photosensitive semiconductor element scanned by said light beam.

10. A method according to claim 8 or 9, wherein said switching element includes redundant elements being incorporated in or removed from a connection between said drive line and said portions of said display elements depending on test results.

11. A method according to claim 10, wherein said laser beam establishes or interrupts said connection.

12. A method according to claim 9, wherein said photosensitive semiconductor elements are laterally separated.

13. A method according to claim 1, 2, 3, 4, 5, or 6, wherein said switching element includes redundant elements being incorporated in or removed from a connection between said drive line and said portions of said display elements depending on test results.

14. A method according to claim 13, wherein a laser beam establishes or interrupts said connection.

* * * * *